United States Patent [19]
Tsai et al.

[11] Patent Number: 6,020,242
[45] Date of Patent: Feb. 1, 2000

[54] EFFECTIVE SILICIDE BLOCKING

[75] Inventors: Jiunn-Yann Tsai; Shiuh-Luen Wang, both of San Jose; Wen-Chin Yeh, Fremont, all of Calif.

[73] Assignee: LSI Logic Corporation, Milpitas, Calif.

[21] Appl. No.: 08/926,590

[22] Filed: Sep. 4, 1997

[51] Int. Cl.[7] .................................................. H01L 21/336
[52] U.S. Cl. ........................... 438/279; 438/286; 438/303
[58] Field of Search .................................. 438/303, 279, 438/286

[56] References Cited

U.S. PATENT DOCUMENTS

| | | | |
|---|---|---|---|
| 4,263,058 | 4/1981 | Brown et al. ................................. | 148/6 |
| 5,132,756 | 7/1992 | Matsuda ................................. | 357/23.1 |
| 5,227,320 | 7/1993 | Johnson et al. ............................ | 437/44 |
| 5,231,042 | 7/1993 | Ilderem et al. ............................ | 437/44 |
| 5,256,585 | 10/1993 | Bae .......................................... | 437/44 |
| 5,306,951 | 4/1994 | Lee et al. ................................. | 257/755 |
| 5,397,722 | 3/1995 | Bashir et al. ............................ | 437/41 |
| 5,444,024 | 8/1995 | Anjum et al. ............................ | 437/200 |
| 5,473,184 | 12/1995 | Murai ...................................... | 257/382 |
| 5,565,383 | 10/1996 | Sakai ....................................... | 437/200 |
| 5,580,806 | 12/1996 | Chang et al. ............................. | 437/44 |
| 5,658,807 | 8/1997 | Manning ................................. | 438/158 |
| 5,714,413 | 2/1998 | Brigham et al. . | |
| 5,716,866 | 2/1998 | Dow et al. . | |
| 5,783,475 | 11/1997 | Ramaswami . | |
| 5,789,289 | 11/1996 | Gardner et al. . | |
| 5,849,616 | 4/1995 | Ogoh . | |
| 5,851,890 | 12/1998 | Tsia et al. . | |
| 5,882,973 | 1/1997 | Gardner et al. . | |

OTHER PUBLICATIONS

Ronkainen et al, "The use of disposeable double spacer and self–aligned cobalt silicide for LDD MOSFET fabrication," IEEE Electron device letters vol. 12, No. 3, pp. 125–127, Mar. 1991.

Leung, et al A high performance submicron twin tub V technology for custom VLSI Applications, IEEE 1988 Integrated Circuits Conference, pp. 25.1.1–25.1.4, 1988.

*Primary Examiner*—Richard Booth
*Assistant Examiner*—Jonathan Hack
*Attorney, Agent, or Firm*—Beyer & Weaver, LLP

[57] ABSTRACT

A metal silicide blocking process for preventing formation of metal silicide on a first device and allowing formation of metal silicide on elements of a second device of an integrated circuit substrate is described. The process includes forming a gate electrode above the integrated circuit substrate, forming a first dielectric layer over the gate electrode and the substrate surface, forming a second dielectric layer above the first dielectric layer, etching anisotropically the second dielectric layer to form a second spacer portion adjacent to the first dielectric layer; masking the substrate surface of the first device to protect the first dielectric layer above the first device from being removed such that the substrate surface at the second device where the metal silicide is to be formed is exposed, etching the first dielectric layer to form a first spacer portion disposed between the gate electrode of the second device and the second spacer portion, the first spacer portion extends underneath the second spacer portion such that the first spacer portion is disposed between the second spacer portion and a portion of the substrate disposed beneath the second spacer portion, exposing the substrate surface of the first device, depositing a metal layer on the substrate surface and fusing metal ions from the metal layer with silicon ions from a plurality of device elements from the portion of the substrate surface where the metal silicide is to be formed to form metal silicide contact areas above the plurality of device elements.

19 Claims, 12 Drawing Sheets

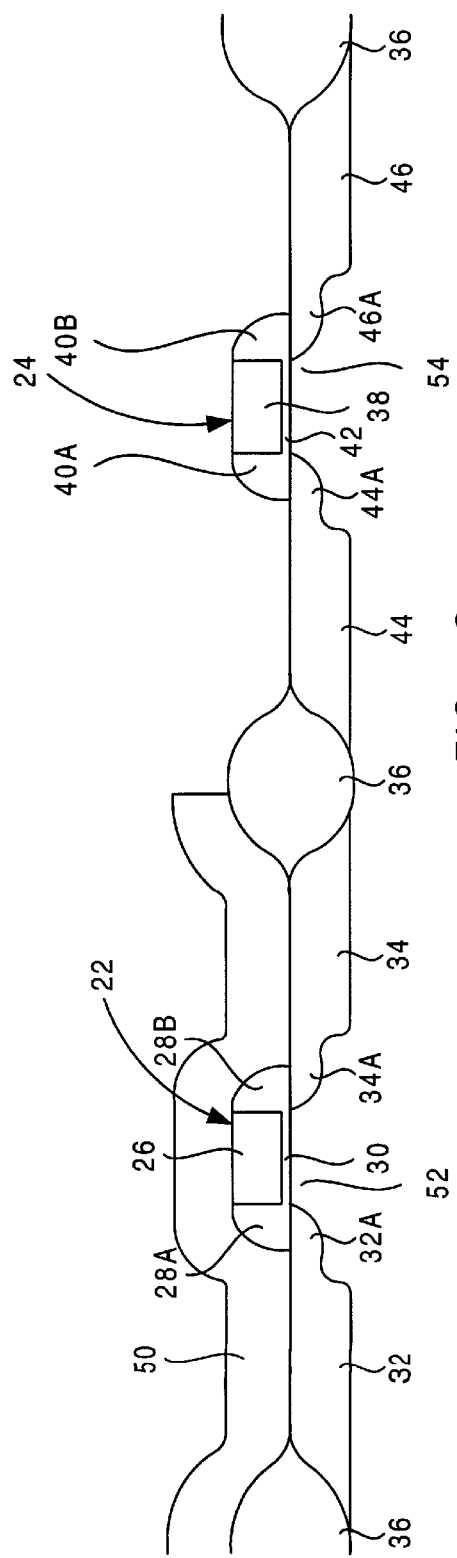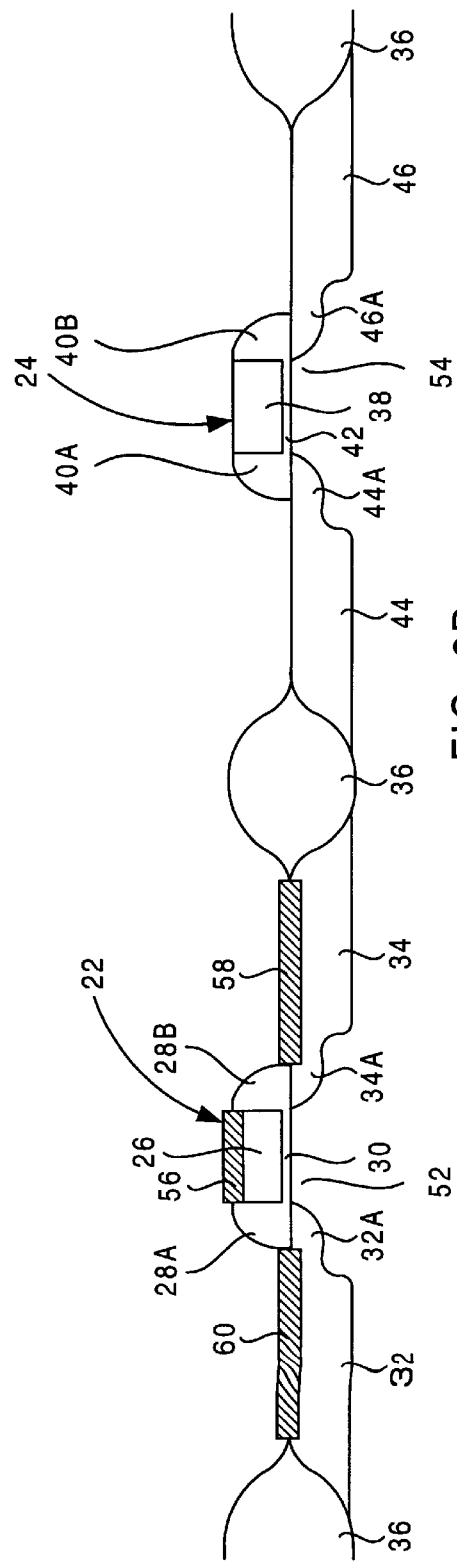

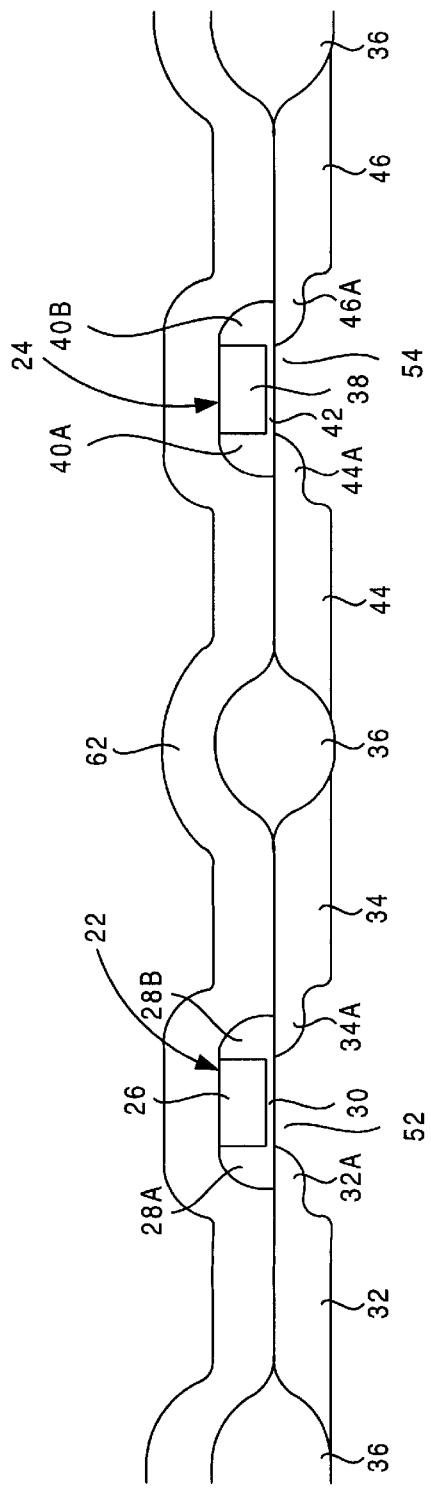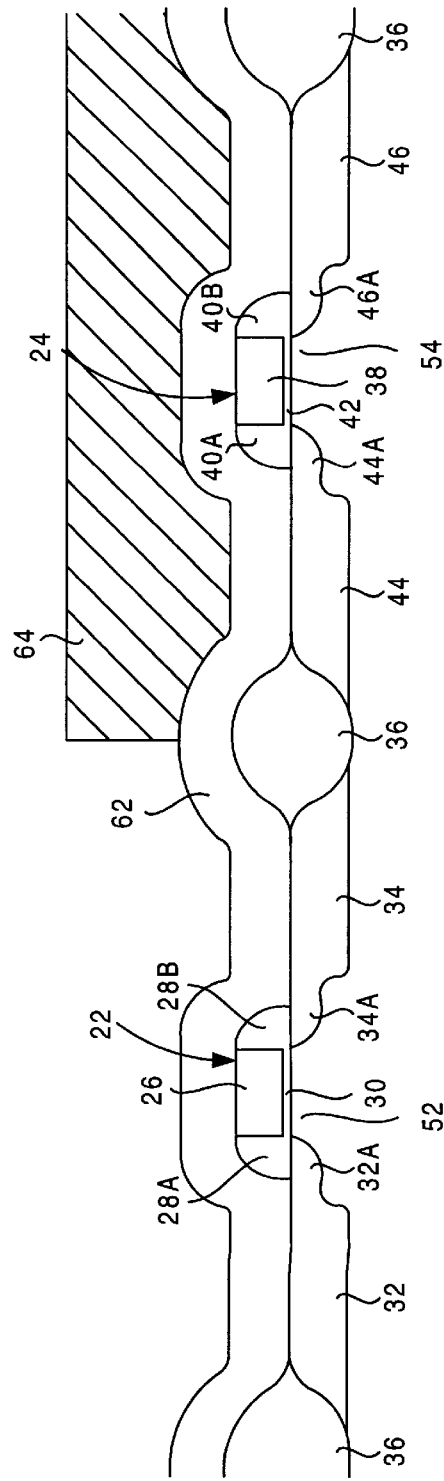

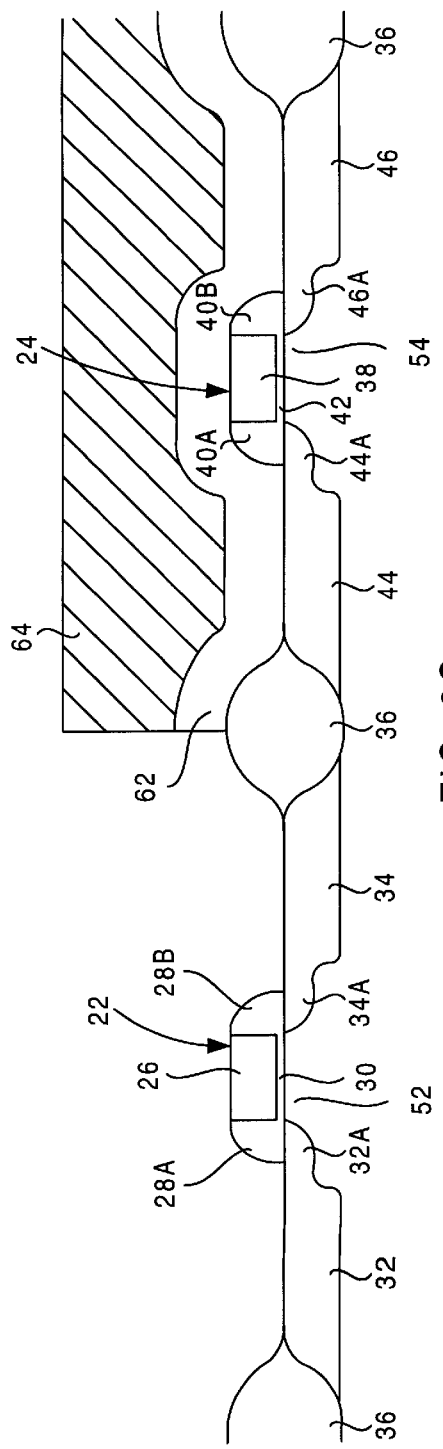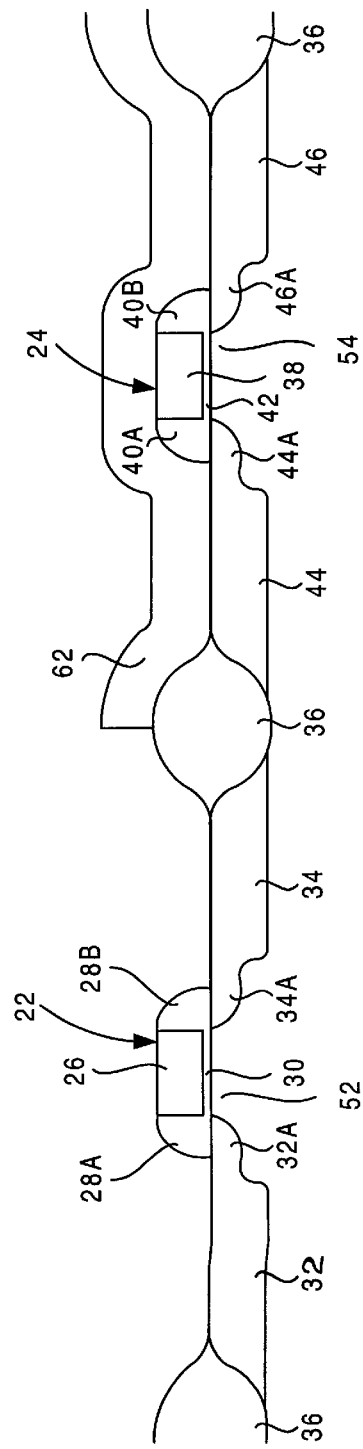

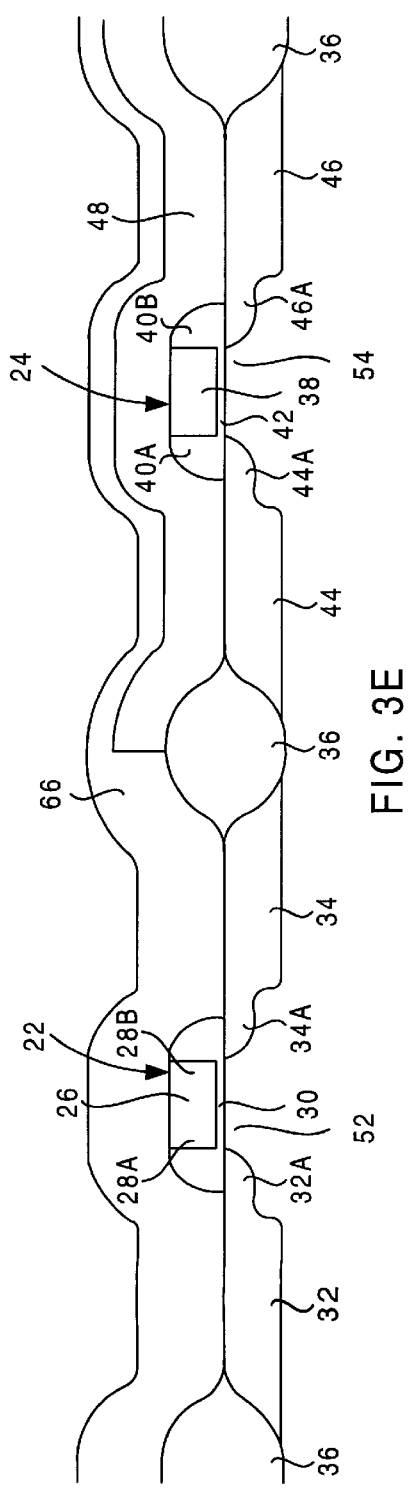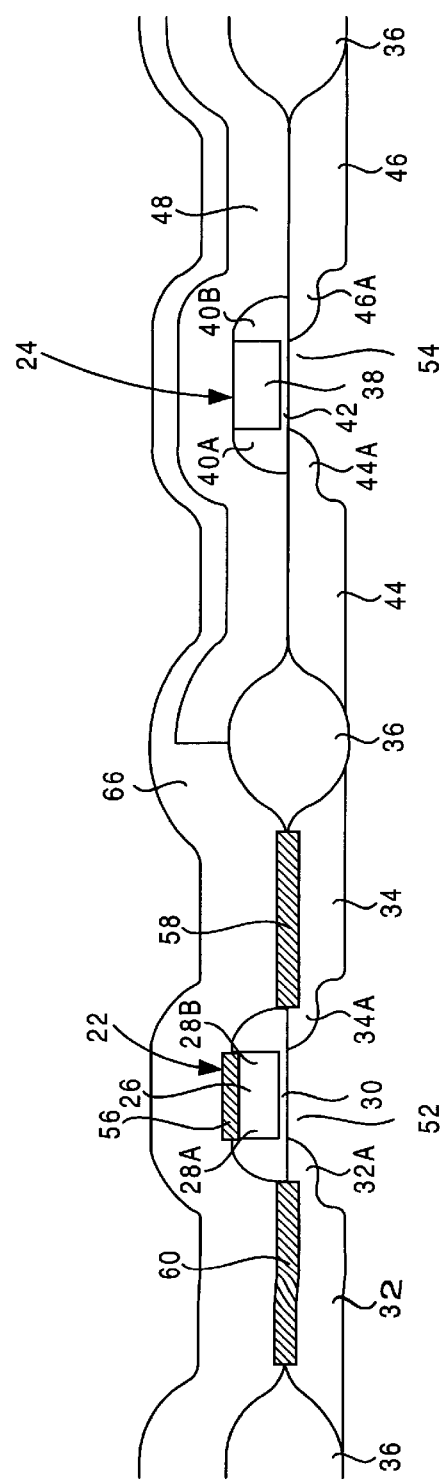

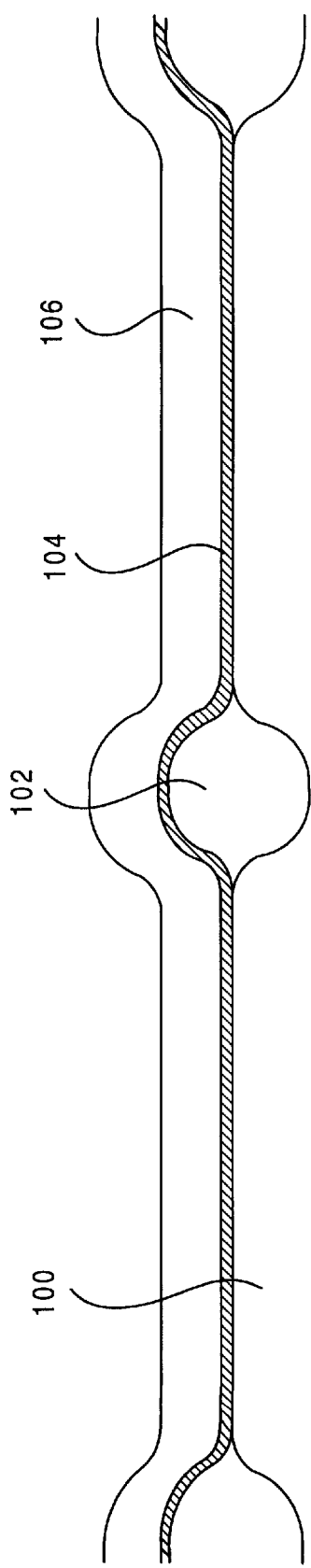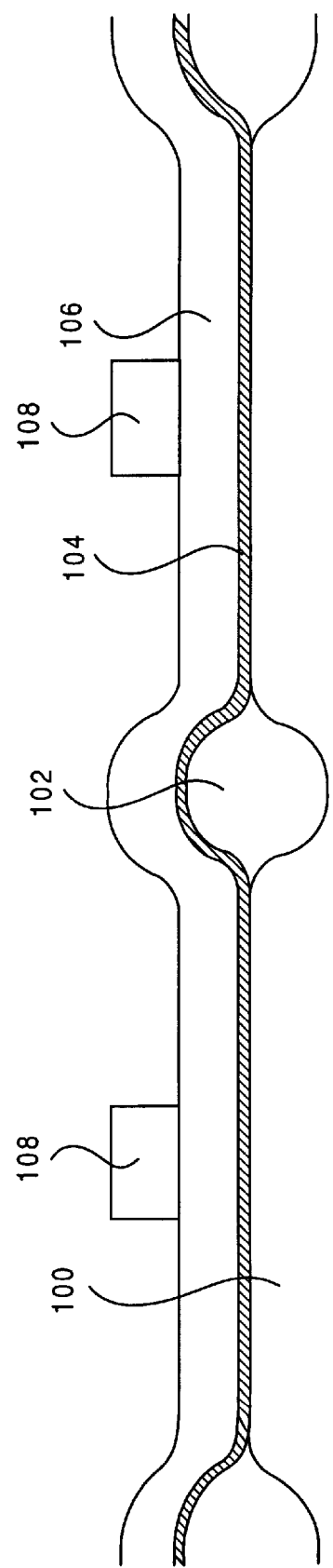

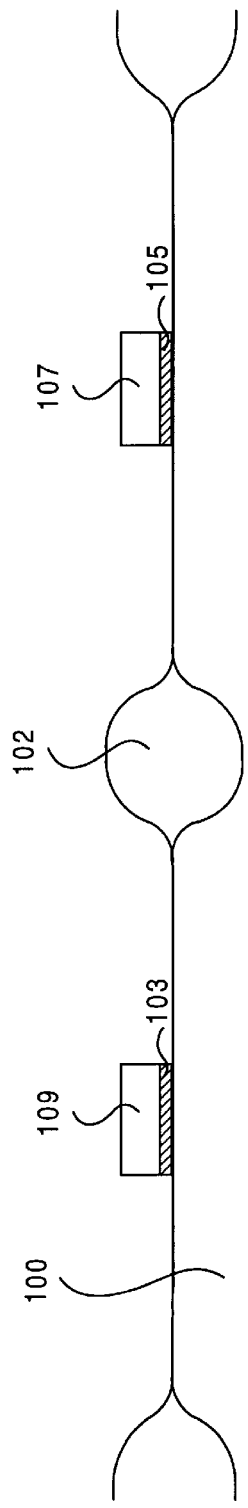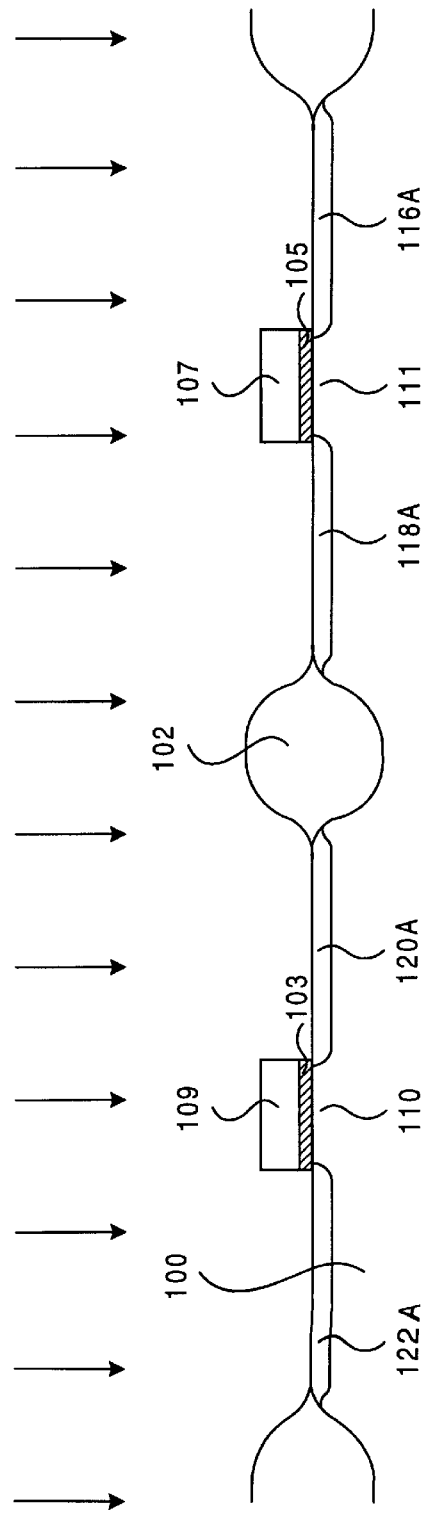

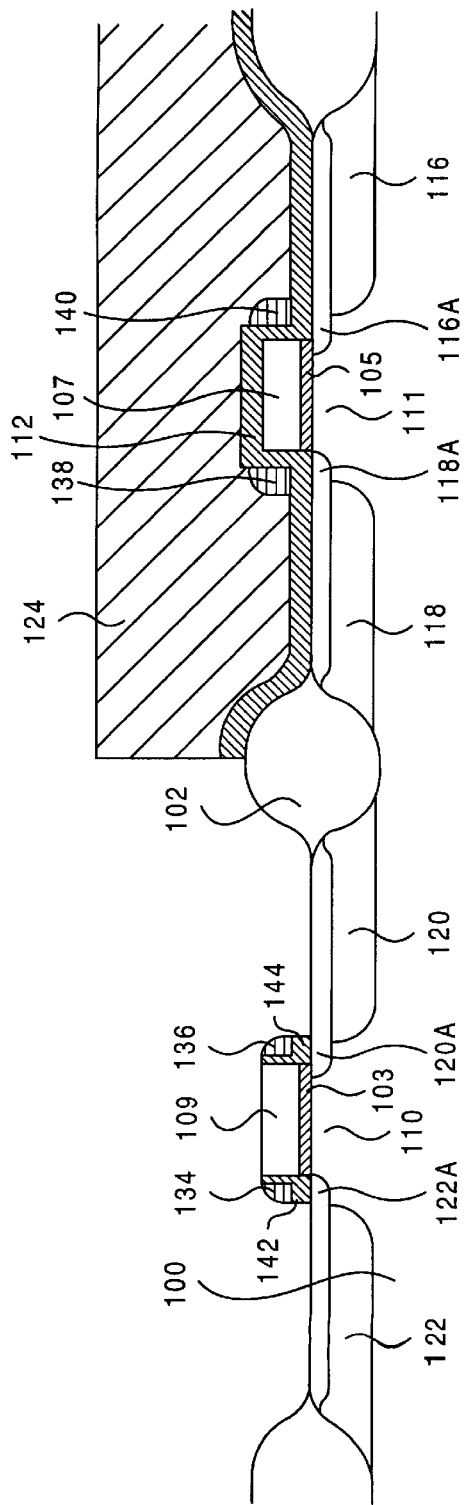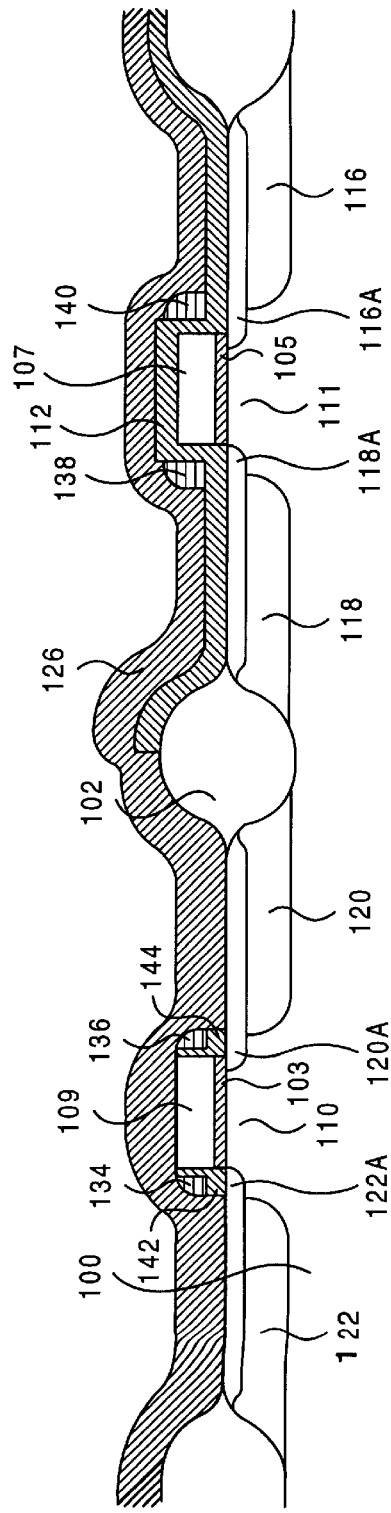

EFFECTIVE SILICIDE BLOCKING

BACKGROUND OF THE INVENTION

The present invention relates to silicide blocking processes during integrated circuit (IC) fabrication. More particularly, the present invention relates to forming metal silicides on certain areas of integrated circuits (ICs) and effectively blocking metal silicide formation on other areas of ICs.

Metal silicide or "silicide", as it is commonly known in the (integrated circuit) IC art, is typically formed at contact areas of MOS (metal oxide semiconductor) device elements, e.g., gate electrode, source and drain regions, by fusing together metal ions from a metal layer and silicon ions from the device elements. As used herein the term "contact area," refers to a top portion of the device element from where connections to other devices elements or IC features is made. The presence of silicide at a contact area increases the conductivity of the contact area and thereby facilitates a solid electrical connection between device elements and metal contacts. Commonly formed silicides include titanium disilicide ($TiSi_2$) and cobalt disilicide ($CoSi_2$). It is desirable to form silicide at contact areas of devices elements in logic and SRAM (Static Random Access Memory) areas of the IC because silicide formation in such areas dramatically reduces the RC gate delay and improves resistance of devices in series.

It is, however, undesirable to form silicide above the device elements in IC areas that are dedicated to implementing DRAM (Dynamic Random Access Memory), input/output and analog applications. By way of example, on the source and drain regions of a DRAM transistor device, silicide formation increases the p-n or n-p junction leakage and degrades the memory refresh time. As another example, in the input/output pad circuitry, the presence of silicide degrades the electrostatic discharge protection. As yet another example, in the analog area of the IC, where resistors are frequently employed, silicide formation lowers the resistance of the resistors.

FIG. 1 shows an idealized IC surface 10 having arranged thereon an input/output pad area 12 near the periphery of IC 10, a logic area 14 containing a plurality of devices dedicated to performing logic applications of the IC adjacent to input/output pad area 12, an analog area 16 positioned below logic area 14 and a DRAM (dynamic random access memory) area 18 positioned adjacent to logic area 12. For the above mentioned reasons, the formation of silicide on the device elements in DRAM area 18, input/output pad area 12, and analog area 16 should be prevented or such areas must undergo silicide blocking when silicide is being formed above device elements in logic area 14, for example.

One current approach, sometimes referred to as "ultrasonic vibration technique," of silicide blocking on a portion of a partially fabricated IC is set forth in FIGS. 2A–2D. FIG. 2A shows a partially fabricated IC surface including MOS (Metal Oxide Semiconductor) transistor devices 22 and 24, which are fabricated according to conventional methods well known to those skilled in the art. Device 24 may be located in DRAM area 18, input/output pad area 12 or analog area 16 of FIG. 1, for example, and therefore undergoes silicide blocking, i.e. the contact areas of the elements of device 24 are blocked or prevented from undergoing silicide formation. Devices 24 and 22 are separated by a field oxide 36 and device 22 may be located in logic area 14 of FIG. 1, for example.

Device 22 of FIG. 2A includes a channel region 52 separating a heavily doped source region 32 with an associated lightly doped "tab" 32A and a heavily doped drain region 34 with an associated lightly doped "tab" 34A. An insulating gate oxide 30 is formed between the surface of device 22 and a gate electrode 26, which is flanked by silicon dioxide (hereinafter referred to as "oxide") spacers 28A and 28B on both sides. Device 24 similarly includes a channel region 54, a heavily doped source region 44 with an associated lightly doped "tab" 44A, a heavily doped drain region 46 with an associated lightly doped "tab" 46A, an insulating gate oxide 42, a gate electrode 38 and oxide spacers 40A and 40B in substantially the same configuration as device 22.

A photoresist layer is blanket deposited on the IC surface and then patterned by conventional photolithography to mask those portions of the IC that require silicide blocking. FIG. 2A shows a photoresist layer 48 masking the surface of device 24 and exposing device 22. A metal layer 50, e.g., cobalt or titanium, is then blanket deposited over the IC surface of FIG. 2A, as shown in FIG. 2B. Next, the partially fabricated IC of FIG. 2C is formed when a portion of metal layer 50 along with photoresist layer 48 disposed atop device 24 is removed or lifted-off by subjecting the IC surface to ultrasonic vibrations. A portion of metal layer 50 deposited above device 22, however, remains on the IC surface as shown in FIG. 2C.

A thermal reaction between metal ions of layer 50 above device 22 and silicon ions at polysilicon gate electrode 26 at a temperature of between about 400 and about 700° C. fuses together the metal and silicon ions to form a first silicide contact area 56 on gate electrode 26, as shown in FIG. 2D. Metal ions of layer 50 similarly fuse with the silicon ions at source 32 and drain 34 to form a second and third silicide contact area 58 and 60, respectively. The temperature range mentioned above, however, is not high enough for the metal ions in metal layer 50 to react with the oxide spacers disposed below. Portions of metal layer deposited above spacers 28A and 28B are removed, as shown by FIG. 2D, by a wet etch solution. By way of example, for titanium metal layer etching, the wet etch solution contains water ($H_2O$), ammonia ($NH_4OH$) and hydrogen peroxide ($H_2O_2$) at a ratio of 4:1:1, respectively and for cobalt metal layer etching, the wet solution contains water ($H_2O$) sulfuric acid ($H_2SO_4$) and hydrogen peroxide ($H_2O_2$) at a ratio of 4:3:1, respectively.

Unfortunately, as the current IC technology strives to significantly reduce IC feature sizes, it is difficult to completely lift-off the metal layer by ultrasonic vibrations from above a certain device, such as device 24 of FIG. 2C, because such a technique is relatively imprecise. As a result, some metal may remain and undesirably form silicide above the device elements of the DRAM, input/output pads and analog areas of the IC, for example. Furthermore, after a substantial portion of the photoresist layer is removed, the photoresist residue contaminates the areas above the device elements on the IC surface where silicide contact areas are subsequently formed. The contaminated metal-silicon interface forms a contact area that provides a weak electrical connection to other device elements and features of the IC.

A second approach (hereinafter referred to as the "LTO deposition technique") currently employed for silicide blocking is set forth in FIGS. 3A–3F. As shown in FIG. 3A, a low temperature oxide (LTO) 62 is blanket deposited on the surface of the partially fabricated IC of FIG. 2A. A photoresist layer 64 is then patterned by conventional photolithography to mask those regions of the IC surface that require silicide blocking. FIG. 3B shows that a photoresist layer 64 masks device 24, but not device 22. LTO layer 62 above the unmasked device 22 is then etched using hydrofluoric acid (HF) to form the partially fabricated structure shown in FIG. 3C. Next, the structure shown in FIG. 3D is formed when photoresist layer 64 above device 24 is removed by techniques, e.g., wet etching and ashing, well known to those skilled in the art. A metal layer 66 is blanket deposited on the surface of the partially fabricated IC, as shown in FIG. 3E.

The partially fabricated IC surface then undergoes heat treatment at a temperature of between about 400 and about 700° C. and the metal ions of layer 66 above device 22 fuse with the silicon ions at polysilicon gate electrode 26 to form a first silicide contact area 56 on gate electrode 26, as shown in FIG. 3F. Similarly, metal ions of layer 66 fuse with the silicon ions at source 32 and drain 34 to form a second and third silicide contact areas 58 and 60, respectively. It should be borne in mind that this temperature range is not high enough for LTO layer 62 to react with metal layer 66 above device 24. Next, unreacted metal layer 66 overlying contact areas 56, 58 and 60, spacers 28A and 28B and device 24 is removed by well known etching techniques mentioned above to form the structure shown in FIG. 2D. LTO layer 62 on device 24 of FIG. 3F may not be removed and may be incorporated into interlayer dielectric (ILD) formed above the gate electrode.

Unfortunately the LTO deposition technique suffers from several drawbacks. By way of example, the LTO deposition technique requires extra steps of depositing, patterning and etching an LTO layer. This translates into a lower throughput for the IC fabrication process. As another example, removal of LTO layer 62 above device 22 in FIG. 3C by etching using HF may at least partially dissolve oxide spacers 28A and 28B. As a result, the oxide spacers are severely damaged and there is poor isolation between the gate electrode and source and drain.

Additionally, in the two approaches described above, as well as in all the conventional silicide blocking methods, contact areas formed at a top portion of the device elements are often thin and rough due to the conventional step of reactive ion etching (RIE) of the oxide layer to form spacers. These damaged areas create a poor reactive site between metal and silicon ions to form silicide thereon.

What is therefore needed is an effective silicide blocking process to block or prevent silicide formation above preselected device elements.

SUMMARY OF THE INVENTION

To achieve the foregoing, the present invention provides a process for forming a composite spacer having at least two spacer portions adjacent a gate electrode disposed above an integrated circuit substrate surface. The process includes forming the gate electrode above the integrated circuit substrate, forming a first dielectric layer over the gate electrode and the substrate surface, forming a second dielectric layer above the first dielectric layer, etching anisotropically the second dielectric layer to form a second spacer portion adjacent to the first dielectric layer, and etching the first dielectric layer to form a first spacer portion disposed between the gate electrode and the second spacer portion, the first spacer portion extends underneath the second spacer portion such that the first spacer portion is disposed between the second spacer portion and the substrate surface.

The first dielectric layer may be made from silicon dioxide and the second dielectric layer may be made from a material that is resistant to hydrofluoric acid, e.g., silicon nitride. The first dielectric layer may be at least one of deposited or grown on the substrate surface. The step of etching anistropically the second dielectric layer may include reactive ion etching the second dielectric layer. The step of etching the first dielectric layer to form a first spacer portion may include etching the first dielectric layer using a dilute solution of hydrofluoric acid. The process of forming a spacer mentioned above may further include a step of performing a lightly doped ion implant to form lightly doped source and drain regions in the substrate after the step of forming the gate electrode. The process of forming a composite spacer may also include a step of performing a heavily doped ion implant to form a heavily doped source region and a heavily doped drain region in the substrate after the step of etching anistropically the second dielectric layer.

In another aspect, the present invention provides a metal silicide blocking process for preventing formation of metal silicide on a first device and allowing formation of metal silicide on elements of a second device of an integrated circuit substrate. The silicide blocking process includes forming the gate electrode above the integrated circuit substrate, forming a first dielectric layer over the gate electrode and the substrate surface, forming a second dielectric layer above the first dielectric layer, etching anisotropically the second dielectric layer to form a second spacer portion adjacent to the first dielectric layer, masking the substrate surface of the first device to protect the first dielectric layer above the first device from being removed such that the substrate surface at the second device where the metal silicide is to be formed is exposed, etching the first dielectric layer to form a first spacer portion disposed between the gate electrode of the second device and the second spacer portion, the first spacer portion extends underneath the second spacer portion such that the first spacer portion is disposed between the second spacer portion and a portion of the substrate disposed beneath the second spacer portion, exposing the substrate surface of the first device, depositing a metal layer on the substrate surface; and fusing metal ions from the metal layer with silicon ions from a plurality of device elements from the portion of the substrate surface where the metal silicide is to be formed to form metal silicide contact areas above the plurality of device elements.

The silicide blocking process of the present invention may further include a step of performing a lightly doped ion implant to form lightly doped source and drain regions in the substrate after the step of forming the gate electrode. The silicide blocking process may also include a step of performing a heavily doped ion implant to form a heavily doped source region and a heavily doped drain region in the substrate after the etching anistropically the second dielectric layer. The silicide blocking process may further include a step of etching a portion of the metal layer that does not fuse in the step of fusing metal ions and silicon ions.

The step of fusing may be a thermal reaction conducted at a temperature of between about 400 and about 700° C. The step of masking the substrate surface of the first device may include patterning a photoresist mask above the substrate surface of the first device. The step of exposing the substrate surface of the first device may include at least one of ashing or wet etching the mask above the substrate surface of the first device. The step of etching at least a portion of the first dielectric layer may include using a dilute solution of hydrofluoric acid to remove the first dielectric layer. The step of depositing the metal layer on the substrate surface may include depositing at least one cobalt or titanium. The step of fusing forms at least one of cobalt disilicide or titanium disilicide.

In another aspect, the present invention provides a semiconductor device having a composite spacer formed adjacent a gate electrode and above an integrated circuit substrate surface. The composite spacer inlcudes a first spacer material formed on the substrate surface such that a first side of the first spacer material contacts the gate electrode, a second spacer material formed such that the second spacer material contacts a portion of a second side of the first spacer material, the first spacer material extends underneath the first spacer material and is disposed between the second spacer material and the substrate surface and a gate oxide disposed between the gate electrode and the substrate surface.

The first spacer material may be made from silicon dioxide and the second spacer material is made from a material that is resistant to hydrofluoric acid, e.g., silicon nitride. The gate oxide may have a thickness of between about 40 and about 60 Angstroms. The semiconductor device may further include metal silicide formed on contact areas of the device. The step of etching may be performed such that the first dielectric layer is maintained while the second spacer is formed.

The present invention represents a marked improvement over the current approaches of silicide blocking. By way of example, silicide blocking according to the present invention is effective even at small geometries and IC feature sizes. As a further example, additional steps of deposition, patterning and etching of the LTO layer are also eliminated in the present invention and as a result the throughput of the IC fabrication process is increased. Furthermore, the undesirable effect of damaging the substrate surface caused during RIE of the LTO layer is also eliminated. Further still, the present invention provides appropriately conductive silicide contact areas by eliminating photoresist contamination.

These and other advantages of the present invention will become apparent upon reading the following detailed description and studying the various figures of the drawings.

BRIEF DESCRIPTION OF THE DRAWINGS

FIGS. 2A–2D show a cross-sectional view of an integrated circuit (IC) undergoin silicide blocking according to a currently employed technique of ultrasonic vibration.

FIGS. 3A–3F show a cross-sectional view of an IC undergoing silicide blocking according to another currently employed technique referred to as a LTO (low temperature oxide) deposition technique.

FIGS. 4A–4K shows a cross-sectional view of an IC undergoing silicide blocking, according to one embodiment of the present invention.

DETAILED DESCRIPTION OF THE PREFERRED EMBODIMENT

The present invention provides a process for forming metal suicides on certain areas of integrated circuits (ICs) and effectively blocking metal silicide formation on other areas of ICs. In the following description, numerous specific details are set forth in order to fully illustrate a preferred embodiment of the present invention. It will be apparent, however, that the present invention may be practiced without limitation to some specific details presented herein.

In the present invention, the spacer material adjacent a gate electrode is a composite spacer that includes a first spacer material, e.g., silicon nitride ($Si_3N_4$, and hereinafter referred to as "nitride") and a second spacer material, e.g., an oxide such as silicon dioxide ($SiO_2$, and hereinafter generically referred to as "oxide"). Those skilled in the art will recognize that conventionally such spacers adjacent a gate electrode are made from a single phase material. The nitride/oxide composite spacer of the present invention, for example, provides the advantages of its constituent nitride and oxide materials. The nitride material provides the benefit of being resistant to hydrofluoric acid (HF), which is typically used for etching a low temperature oxide (LTO) during IC fabrication. The oxide material of the composite spacer provides the benefit of a spacer material with a high dielectric constant. This ensures that there is adequate isolation between the gate electrode and the source and drain areas.

Figure 1:
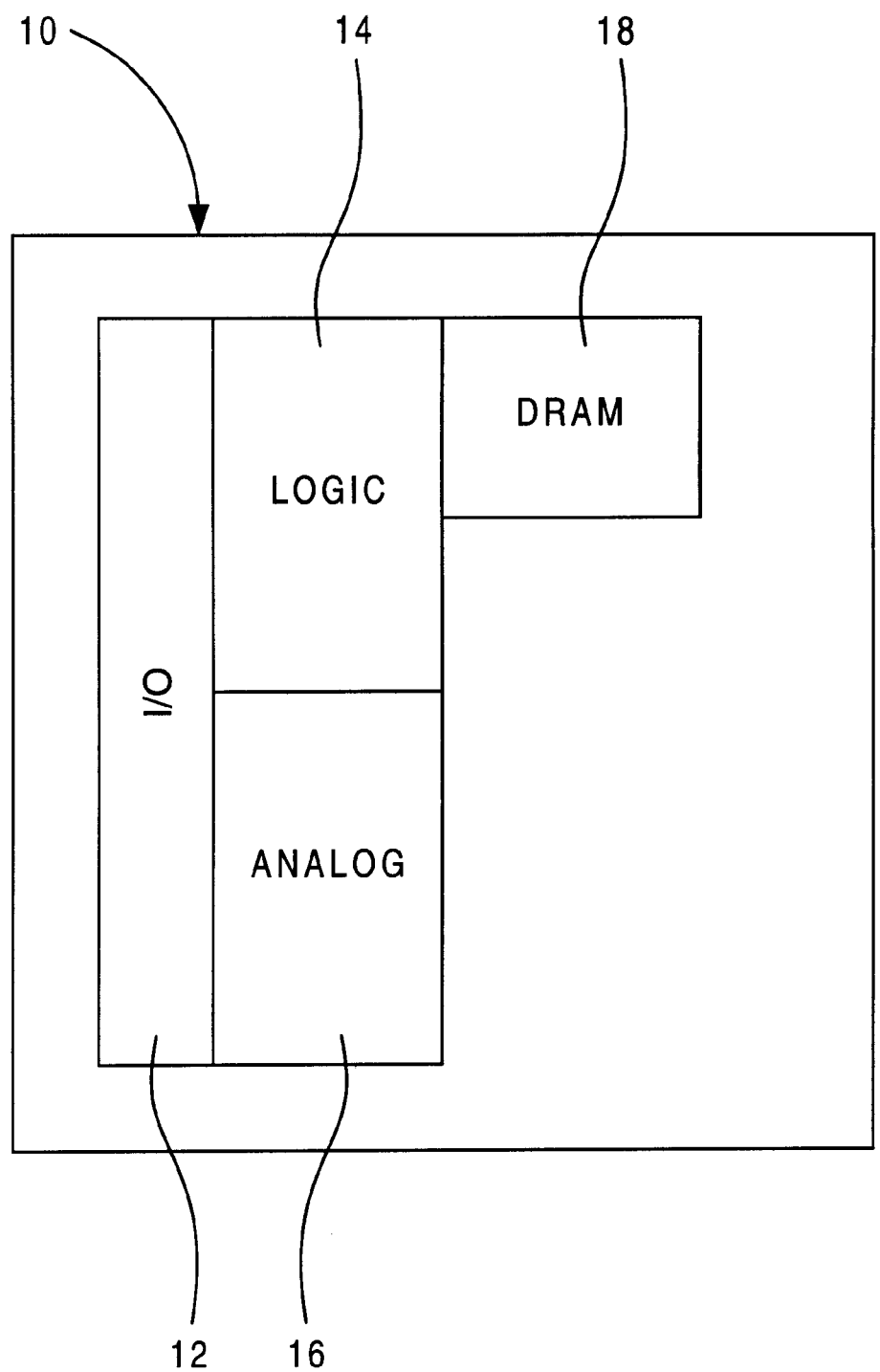
FIG. 1 shows a front view of an idealized integrated circuit (IC) having areas dedicated to implementing DRAM (Dynamic Random Access Memory), input/output, logic and analog applications.
Figure 2A:
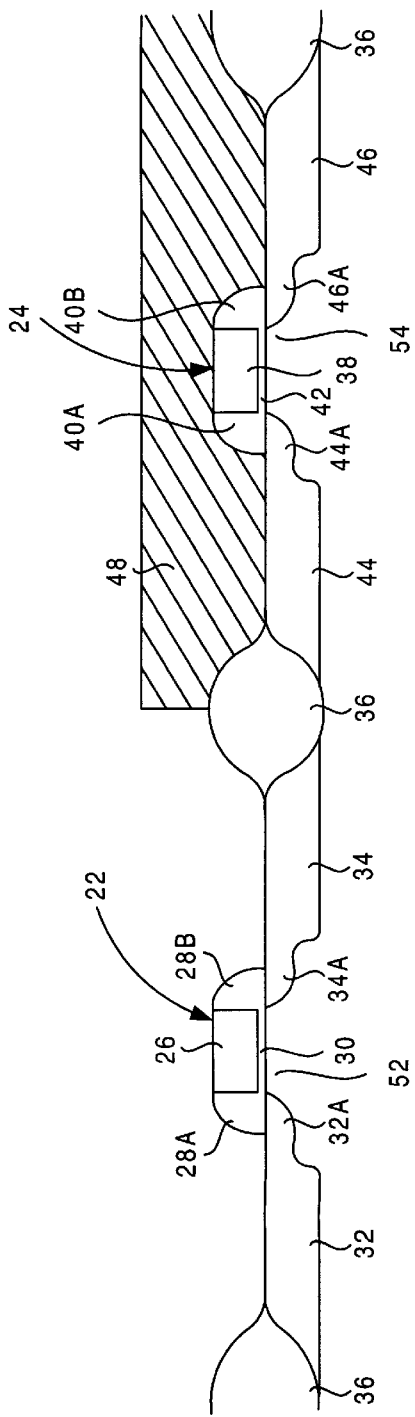
Figure 2B:
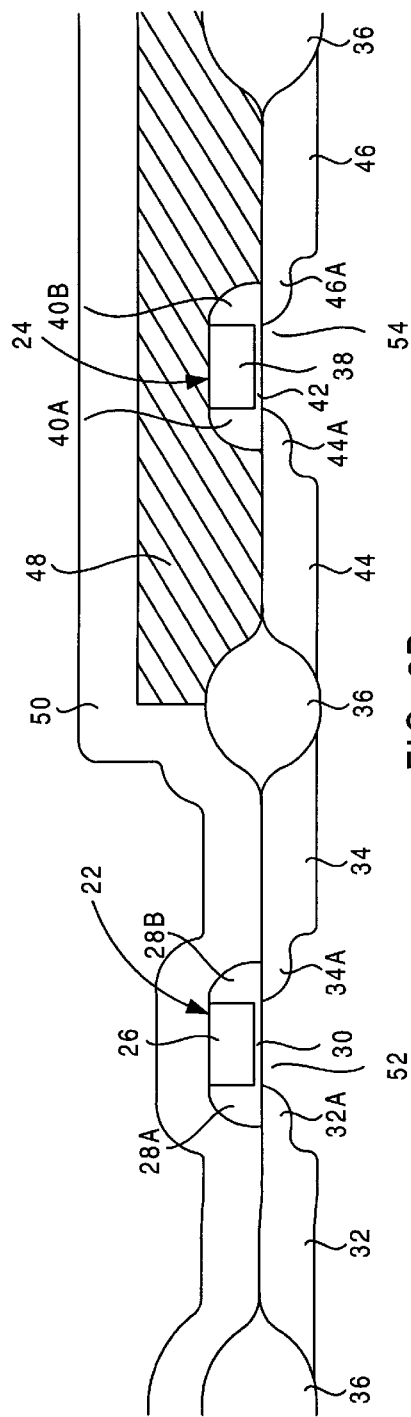
Figure 4E:
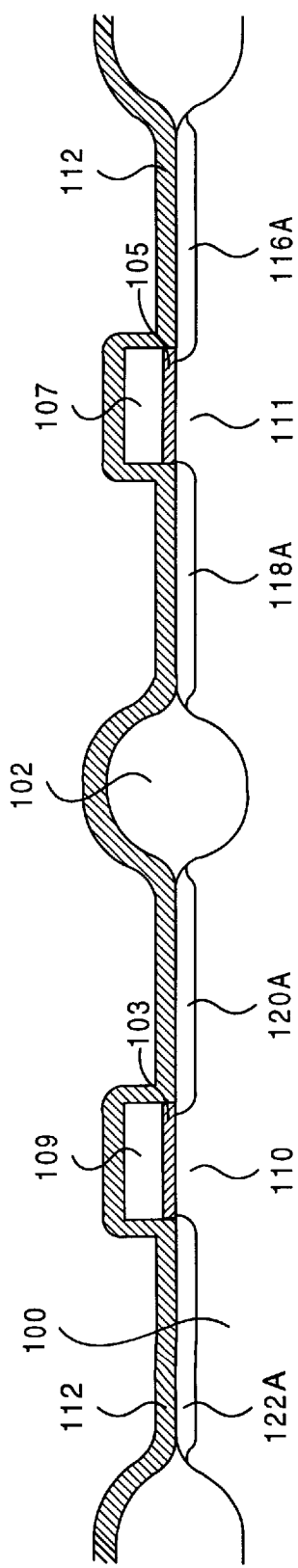

FIGS. 4A–4K show some significant steps of a silicide blocking process, according to one embodiment of the present invention. After a plurality of field oxide 102 are formed on a surface of substrate 100 to separate the sites where MOS (Metal Oxide Semiconductor) transistor devices will be fabricated subsequently, a gate oxide layer 104 that is typically between about 40 and about 60 Angstroms thick is grown on the substrate surface and a polysilicon layer 106 that is about 2500 Angstroms thick is deposited (typically by chemical vapor deposition) on the substrate surface, as shown in FIG. 4A. Those skilled in the art will recognize that before layers 104 and 106 are fabricated, a "p" or "n" type well region (not shown to simplify illustration) extending downward from the substrate surface into its bulk may be formed. Alternatively, the substrate bulk itself may be doped "p" or "n" type, thus obviating the need for a separate well region.

A photoresist mask is then patterned by conventional photolithography to define masks 108 on layers 104 and 106, as shown in FIG. 4B, and thereby selectively expose certain regions of the substrate surface to an etchant solution. Next, gate oxide layer 104 and polysilicon layer 106 at the exposed regions are etched according to conventional techniques known to those skilled in the art to form gate electrodes 109 and 107 on gate oxide 103 and 105, respectively, as shown in FIG. 4C. A "p" or "n" type dopant ($BF_2$ or arsenic) implant is then conducted at a dose of between about $1 \times 10^{13}$ $cm^{-2}$ and about $1 \times 10^{15}$ $cm^{-2}$ and energy of between about 10 and about 50 keV to form a lightly doped source or drain regions 122A, 120A, 118A and 116A, as shown in FIG. 4D. This figure also shows a first channel region 110 extending between lightly doped source and drain regions 122A and 122A and a second channel region 111 extending between lightly doped source and drain regions 118A and 116A.

Figure 4F:
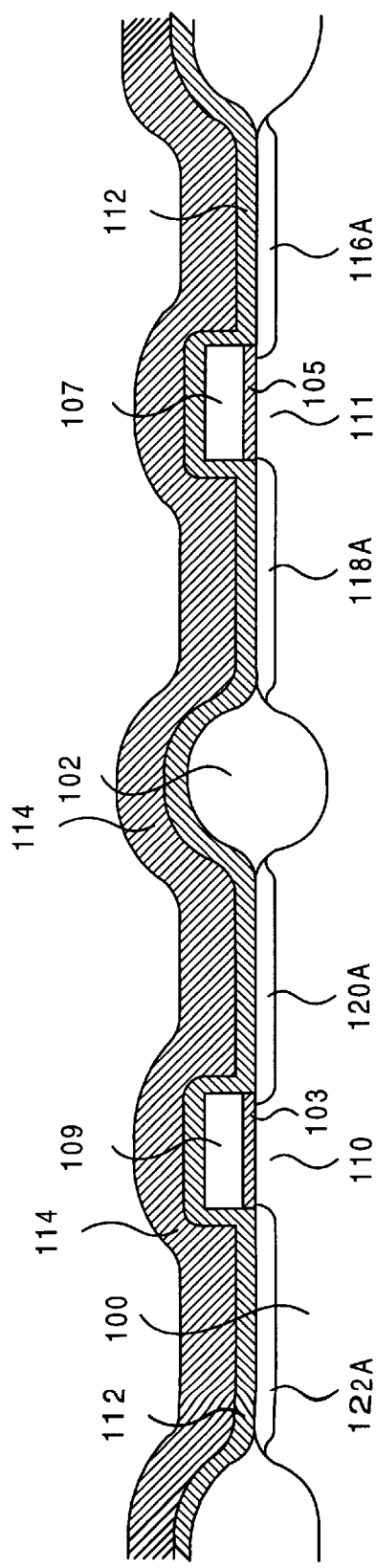

Next, as show in FIG. 4E, a low temperature oxide (LTO) layer 112 that is about 200 Angstroms thick is blanket deposited or grown on the substrate surface of FIG. 4D. Above LTO layer 112, a nitride layer 114 having a thickness of about 1500 Angstroms is then blanket deposited, as shown in FIG. 4F. In order to form the structure shown in FIG. 4G, LTO layer 112 and nitride layer 114 are anisotropically etched by reactive ion etching (RIE) to form nitride spacers 134 and 136 adjacent to gate oxide layerl 12, which is in turn next to and above gate electrode 109. Referring now to the partially fabricated device to the right of field oxide region 102, nitride spacers 138 and 140 are formed adjacent to gate oxide layer 112, which is similarly next to and above gate electrode 107.

Figure 4G:
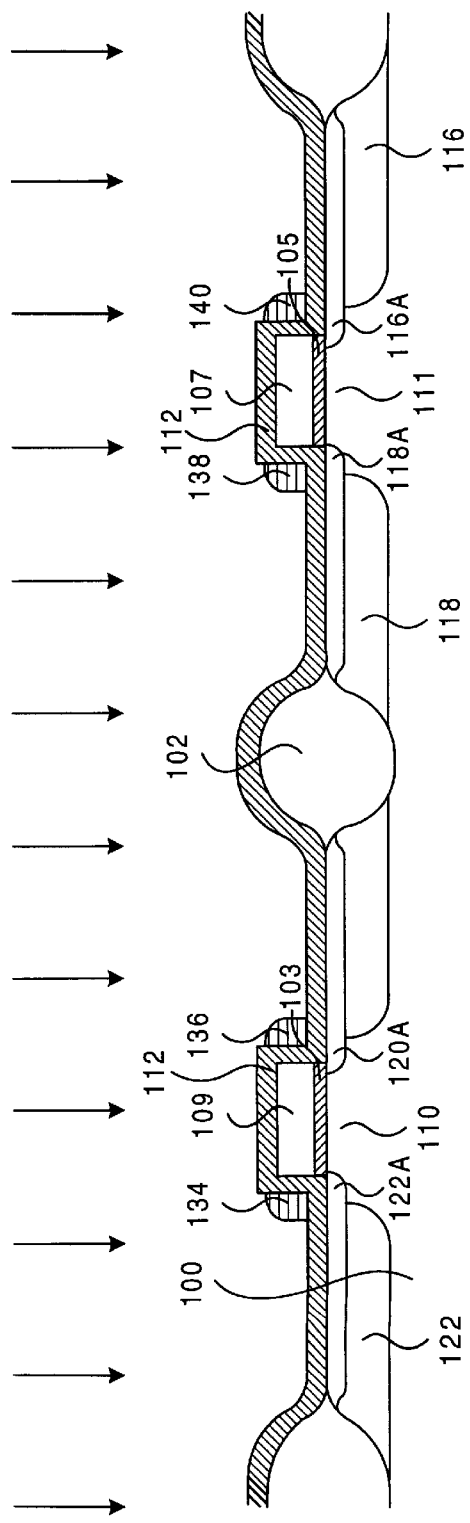

A deeper "p" or "n" type dopant implant is then conducted, as shown in FIG. 4G, on the substrate surface to form heavily doped source and drain areas 122 and 120, respectively, below lightly doped source and drain areas 122A and 120A. In an alternative embodiment, where a CMOS (Complementary Metal Oxide Semiconductor) device is formed in the IC, two separate ion implant steps are performed. The first ion implant step may include performing an n-type ion implant to form an NMOS device, while the PMOS regions are masked and second implant step may include performing a p-type implant to form a PMOS device, while the NMOS regions are masked. In this maner, the p- and n-type transistors are formed separately in substrate 100.

Figure 4H:
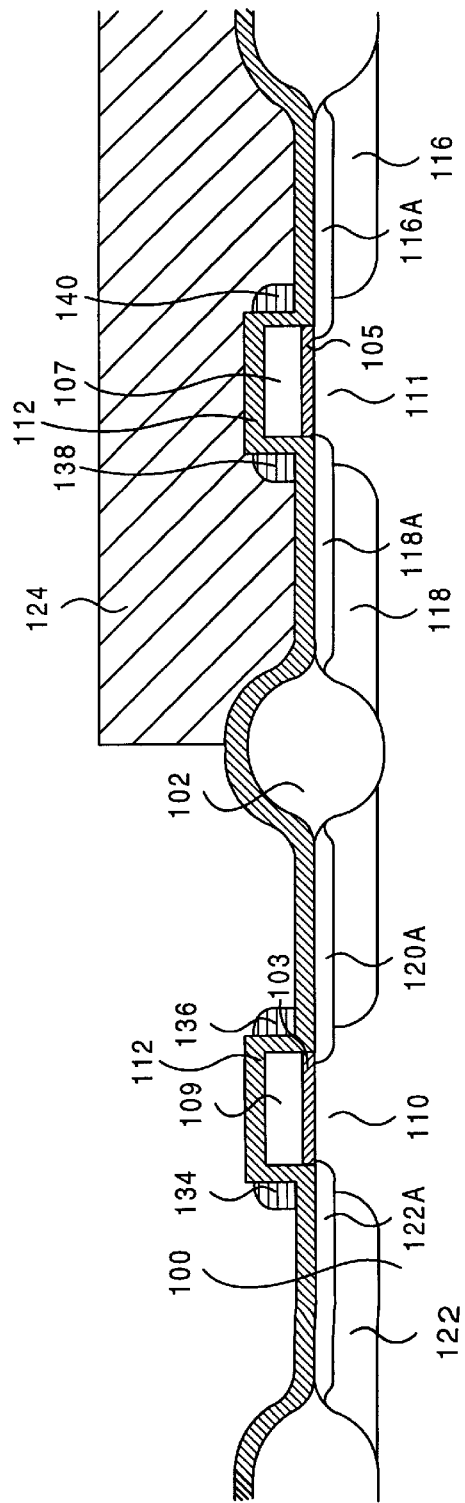

As shown in FIG. 4H, a photoresist layer 124 is then patterned according to well known steps to define a mask on the partially fabricated device to the right of field oxide region 102 and a partially fabricated device formed to the left of field oxide region 102 is exposed. It should be noted that for exemplary purposes that the partially fabricated device to the right of field oxide region 102 is preselected to undergo silicide blocking and the partially fabricated device to the left of field oxide region 102 will have silicide contact areas formed at a top portion of its elements. The partially fabricated device on the right side may therefore belong to the DRAM, analog or input/output pad areas of the IC and the partially fabricated device on the left side may belong to the logic or SRAM areas of the IC.

It is worth noting that silicide blocking according to the present invention avoids the contamination of the metal-silicon interface (subsequently formed above elements of the device on the left) due to photoresist residue because the presence of gate oxide layer 112 in that region of the IC, as shown in FIG. 4H, protects the substrate surface from photoresist layer 124 before it is patterned. As mentioned above, one drawback of the ultrasonic vibration technique of silicide blocking is the formation of poorly conductive contact areas due to the contamination of the metal-silicon interface by the photoresist residue on the substrate surface before metal deposition takes place. However, according to the present invention, photoresist layer 124 does not directly contact the portion of the substrate surface where silicide contact areas are formed. Consequently, the silicide contact areas of the present invention have appropriate conductivity.

Next, the exposed gate oxide layer 112 above the partially fabricated device on the left side is etched using a dilute solution of hydrofluoric acid (HF), but gate oxide layer 112 above the device on the right side remains intact as it is masked by photoresist layer 124. It is important to note that nitride spacers 134 and 136 do not degrade under the presence of HF during the oxide etch because nitride is well known in the art to withstand an HF attack. FIG. 4I shows that nitride/oxide composite spacers, according to the present invention, are formed adjacent to both sides of gate electrode 109. In other words, the nitride/oxide composite spacers of the present invention flank the right and left sides of gate electrode 109. The oxide/nitride spacer to the left of gate electrode 106 includes a reversed "L" shaped oxide spacer 142 that is disposed between gate electrode 109 and nitride spacer 134. The oxide/nitride spacer to the right of gate electrode 109 is nearly a mirror image of the composite spacer on the left. The composite spacer on the right includes a "L" shaped oxide spacer 144 disposed between gate electrode 109 and nitride spacer 136.

The nitride/oxide composite spacers of the present invention provide the advantages of the nitride material in spacers 134 and 136 and oxide material in spacers 146 and 144. The nitride material, as mentioned above is resistant to an HF attack during etching of gate oxide layer 112 of FIG. 4H. The oxide spacers 144 and 146 provide the benefit of a high dielectric constant, which ensures that there is adequate isolation between gate electrode 109 and source and drain areas 122 and 120, respectively.

Figure 4K:
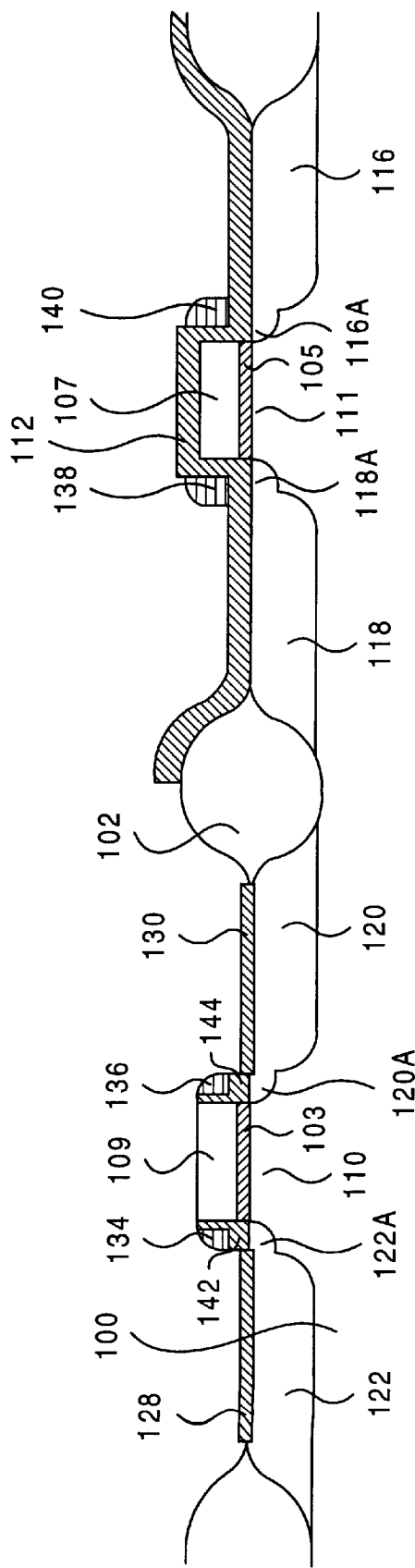

After the nitride/oxide spacers of the present invention are formed, photoresist layer 124 of FIG. 4I is removed by ashing or wet etching using sulfuric acid. A metal layer 126 is then blanket deposited on the substrate surface, as shown by FIG. 4J. In FIG. 4K, a thermal reaction at a temperature of between about 400 and 700° C. is carried out and the metal ions of layer 126 (of FIG. 4J) above the device on the left side fuse with the silicon ions at polysilicon gate electrode 109 to form a first silicide contact area 132. Similarly, metal ions of layer 126 also fuse with the silicon ions at source and drain areas 122 and 120 to form a second and third silicide contact areas 128 and 130, respectively. Those skilled in the art will recognize that silicide contact areas 128, 130 and 132 may also be referred to as self-aligned-silicide or "salicide" contact areas. It is well known in the art that self-aligned-silicide may be referred to as "salicide" because the type of silicide selected forms on the desired contact areas and a separate mask need not be developed to fabricate such silicide formation.

It should be borne in mind that this temperature range is not high enough for metal layer 126 to react with oxide layer 112 disposed above the partially fabricated device on the right side. Furthermore, at this temperature range, metal layer 126 (of FIG. 4J) also does not react with nitride spacers 134 and 136 disposed below it. Next, unreacted portions of metal layer 126 overlying contact areas 128, 130 and 132, spacers 134 and 136 and the partially fabricated device on the right side is removed by well known etching techniques mentioned above to form the structure shown in FIG. 4K. Oxide layer 112 may not be removed and may be incorporated into interlayer dielectric (ILD) formed above gate electrode 107 of the partially fabricated device on the right side. The next step of forming an interlayer dielectric (ILD) will proceed according to methods well known in the art.

The present invention represents a marked improvement over the current approaches of silicide blocking. By way of example, silicide blocking according to the present invention is effective even at small geometries and IC feature sizes. As a further example, additional steps of deposition, patterning and etching of the LTO layer are also eliminated in the present invention and as a result the throughput of the IC fabrication process is increased. Furthermore, the undesirable effect of damaging the substrate surface caused during RIE of the LTO layer is also eliminated. Further still, the present invention provides appropriately conductive silicide contact areas by eliminating photoresist contamination, as mentioned above.

Although the foregoing invention has been described in some detail for purposes of clarity of understanding, it will be apparent that certain changes and modifications may be practiced within the scope of the appended claims. For example, the present invention is described in terms of a nitride/oxide composite spacer, but there is no reason in principle why other similar dielectric materials cannot be used to make the composite spacer according to the present invention. Therefore, the present embodiments are to be considered as illustrative and not restrictive, and the invention is not to be limited to the details given herein, but may be modified within the scope of the appended claims.

What is claimed is:

1. A process for forming a composite spacer having at least two spacer portions adjacent a gate electrode disposed above an integrated circuit substrate surface to allow selective formation of metal silicide on the integrated circuit substrate surface, comprising:

forming said gate electrode above said integrated circuit substrate;

forming a first dielectric layer over said gate electrode and said substrate surface;

forming a second dielectric layer above said first dielectric layer;

etching anisotropically said second dielectric layer to form a second spacer portion adjacent to said first dielectric layer; etching said first dielectric layer to form a first spacer portion disposed between said gate electrode and said second spacer portion, said first spacer portion extends underneath said second spacer portion such that said first spacer portion is disposed between said second spacer portion and said substrate surface; and forming a silicide contact area on at least one of the gate electrode and the integrated circuit substrate surface at a location that is not protected by the first and second spacer portions.

2. The process of claim 1, wherein said first dielectric layer is made from silicon dioxide.

3. The process of claim 1, wherein said second dielectric layer is made from a material that is resistant to hydrofluoric acid.

4. The process of claim 3, wherein said second dielectric layer is made form silicon nitride.

5. The process of claim 1, wherein said first dielectric layer is at least one of deposited or grown on the substrate surface.

6. The process of claim 1, wherein said etching anistropically the second dielectric layer includes reactive ion etching the second dielectric layer.

7. The process of claim 1, wherein said etching said first dielectric layer to form a first spacer portion includes etching said first dielectric layer using a dilute solution of hydrofluoric acid.

8. The process of claim 1, further comprising a step of performing a lightly doped ion implant to form lightly doped source and drain regions in the substrate after said step of forming said gate electrode.

9. The process of claim 1, further comprising a step of performing a heavily doped ion implant to form a heavily doped source region and a heavily doped drain region in the substrate after said etching anistropically said second dielectric layer.

10. A metal silicide blocking process for preventing formation of metal silicide on a first device and allowing formation of metal silicide on elements of a second device of an integrated circuit substrate, comprising:

forming a gate electrode above said integrated circuit substrate;

forming a first dielectric layer over said gate electrode and said substrate surface;

forming a second dielectric layer above said first dielectric layer;

etching anisotropically said second dielectric layer to form a second spacer portion adjacent to said first dielectric layer;

masking said substrate surface of said first device to protect said first dielectric layer above said first device from being removed such that said substrate surface at said second device where said metal silicide is to be formed is exposed;

etching said first dielectric layer to form a first spacer portion disposed between said gate electrode of said second device and said second spacer portion, said first spacer portion extends underneath said second spacer portion such that said first spacer portion is disposed between said second spacer portion and a portion of said substrate disposed beneath said second spacer portion;

exposing said substrate surface of said first device;

depositing a metal layer on said substrate surface; and fusing metal ions from said metal layer with silicon ions from a plurality of device elements from said portion of said substrate surface where said metal silicide is to be formed to form metal silicide contact areas above said plurality of device elements.

11. The process of claim 10, further comprising a step of performing a lightly doped ion implant to form lightly doped source and drain regions in the substrate after said step of forming said gate electrode.

12. The process of claim 10, further comprising a step of performing a heavily doped ion implant to form a heavily doped source region and a heavily doped drain region in the substrate after said etching anistropically said second dielectric layer.

13. The process of claim 10, further comprising a step of etching a portion of said metal layer that does not fuse in said step of fusing metal ions and silicon ions.

14. The process of claim 10, wherein said step of fusing is a thermal reaction conducted at a temperature of between about 400 and about 700° C.

15. The process of claim 10, wherein said masking said substrate surface of said first device includes patterning a photoresist mask above said substrate surface of said first device.

16. The process of claim 15, wherein said exposing said substrate surface of said first device includes at least one of ashing or wet etching said mask above said substrate surface of said first device.

17. The process of claim 10, wherein said etching at least a portion of said first dielectric layer includes using a dilute solution of hydrofluoric acid to remove said first dielectric layer.

18. The process of claim 10, wherein said depositing said metal layer on said substrate surface includes depositing at least one cobalt or titanium.

19. The process of claim 10, wherein said step of fusing forms at least one of cobalt disilicide or titanium disilicide.

* * * * *